United States Patent [19]
Field et al.

[11] Patent Number: 4,583,608
[45] Date of Patent: Apr. 22, 1986

[54] HEAT TREATMENT OF SINGLE CRYSTALS

[75] Inventors: Thomas T. Field, East Killingly; Otis Y. Chen, Manchester; Arthur R. Geary, Meriden; Richard W. Salkeld, South Windsor; Nicholas E. Ulion, Marlborough, all of Conn.

[73] Assignee: United Technologies Corporation, Hartford, Conn.

[21] Appl. No.: 501,662

[22] Filed: Jun. 6, 1983

[51] Int. Cl.⁴ ................................................ C22F 1/10
[52] U.S. Cl. ............................................ 148/1; 148/3; 148/13; 148/162; 148/404; 148/410
[58] Field of Search ..................... 148/404, 410, 1, 3, 148/4, 13, 162

[56] References Cited
U.S. PATENT DOCUMENTS
4,209,348 6/1980 Duhl et al. ........................... 148/410

Primary Examiner—R. Dean
Attorney, Agent, or Firm—Charles E. Sohl

[57] ABSTRACT

Concepts relating to the heat treatment of single crystal superalloy articles are disclosed. A first concept is the use of a heat treatment sequence which includes incipient melting of the article being heat treated followed by one or more steps which essentially heal the incipient melting damage. A second concept relates to the treatment of previously heat treated single crystal articles which have incipient melting. Methods are disclosed for healing this damage and for recovering the mechanical properties of such articles. A third concept disclosed is a particular cycle which permits effective heat treatment of a specific single crystal alloy composition.

3 Claims, 6 Drawing Figures

100 X

100 X

HEAT TREATMENT OF SINGLE CRYSTALS

DESCRIPTION

1. Technical Field

This invention relates to the heat treatment of single crystal superalloy articles.

2. Background Art

Superalloys are metallic materials, usually based on nickel or cobalt, which have useful properties at temperatures on the order of 1400° F. and above. Most commonly used superalloys are based on nickel and derive much of their strength from the formation of a precipitate phase based on $Ni_3M$ where M is Al or Ti. The mechanical properties are strongly affected by the gamma prime morphology. Such alloys contain various other constituents, some of which melt at relatively low temperatures. The localized melting is termed incipient melting and is often a limiting factor in the use of superalloy articles.

It is well known to heat treat cast superalloy articles for the purpose of improving their mechanical properties. Typically such heat treatments include a solutionizing step in which the article is heated to a temperature above the temperature at which the gamma prime phase is taken into solid solution. The article is then cooled, and reheated at a lower temperature for controlled reprecipitation of the gamma prime phase. The solutionizing step cannot exceed the incipient melting temperature. The ability to control the size and distribution of the gamma prime phase permits substantial control over mechanical properties. The application heat treatment of single crystal articles is described in U.S. Pat. No. 4,116,723. It is well known that the incipient melting temperature of a cast superalloy may under certain conditions be increased by heat treatments at temperatures below but near the incipient melting temperature for periods of time sufficient to permit partial homogenization of low melting regions in the article. This is disclosed in U.S. Pat. Nos. 2,798,827; 3,753,790; and 3,783,032. None of these patents refer to single crystal articles and all patents have as a major objective the avoidance of incipient melting.

U.S. Pat. No. 4,209,348 discloses a specific single crystal alloy composition and heat treatment therefor.

DISCLOSURE OF INVENTION

The invention relates to the heat treatment of single crystal superalloy articles. According to one embodiment of the invention, such single crystal articles are heat treated using a heat treatment cycle during the initial stages of which incipient melting occurs within the articles being heat treated. During a subsequent step in the heat treatment process substantial diffusion occurs in the article with the result that the detrimental effects of the previous incipient melting are essentially completely removed. A related embodiment is a heat treatment process for the repair of single crystal articles which have previously undergone incipient melting during a heat treatment process. The use of a heat treatment cycle similar to that previously described permits the substantial elimination of the detrimental effects and evidence of prior incipient melting thereby permitting the use of parts which would otherwise be scrapped. The third embodiment of the invention is a heat treatment cycle for a particular widely used single crystal article composition whose nominal composition is 10% Cr, 5% Al, 1.5% Ti, 4% W, 12% Ta, 5% Co, balance essentially nickel. Articles of this composition may successfully be heat treated with essentially zero rejection rate, using an initial heating step at about 2300° F. followed by controlled heating to about 2340° F. followed by controlled heating at a lesser rate to about 2350° F. with a holding time at 2350° F. of about two hours followed by a controlled heating to a temperature of about 2375° F. with a hold at 2375° F. for about 30 minutes followed by controlled cooling at a rate in excess of about 100° F. per min to a temperature below that of 2000° F. Use of this cycle reduces the rejection rate from a figure of about 40% encountered with prior heat treatment cycles to less than 2% and permits compositional modifications which result in increased mechanical properties.

Other features and advantages will be apparent from the specification and claims and from the accompanying drawings which illustrate an embodiment of the invention.

BEST MODE FOR CARRYING OUT THE INVENTION

Figure 1:
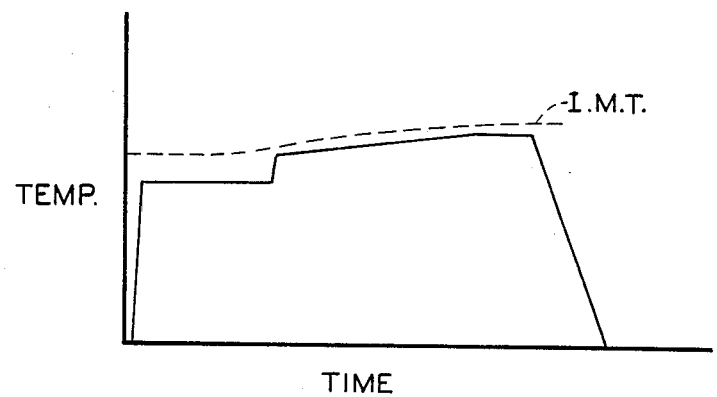
FIG. 1 illustrates a prior art heat treatment.

FIG. 1 illustrates the variation of the incipient melting point during the course of heat treatments as suggested in the prior art namely U.S. Pat. No. 2,798,827; U.S. Pat. No. 3,753,790 and U.S. Pat. No. 3,783,032. As shown in FIG. 1 with time at temperature and increasing temperature, the incipient melting temperature (I.M.T.) increases, but at all times the heat treatment temperature remains below the incipient melting temperature. The increase in incipient melting temperature is the result of the diffusion and homogenization of the low melting point alloy phases.

We have found that in the case of single crystals that the incipient melting temperature may be exceeded during the course of the heat treatment without permanent detrimental effects, provided that the time and temperature of the remainder of the heat treatment is sufficient to heal the damage caused by the incipient melting which has occurred. It should be noted that this possibility is limited to single crystals. In polycrystalline material, either equiaxed material or directionally solidified material, any incipient melting which occurs will occur largely at the grain boundaries and when incipient melting occurs at grain boundaries the detrimental effects of the incipient melting cannot be recovered by subsequent heat treatment. Thus the observation and the benefits of the invention are limited to the case of single crystals which of course have no internal grain boundaries.

Figure 2:
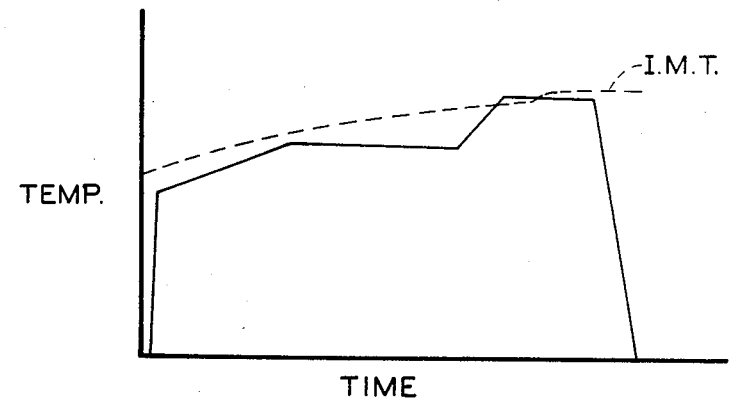
FIG. 2 illustrates a heat treatment according to the invention.
Figure 3:
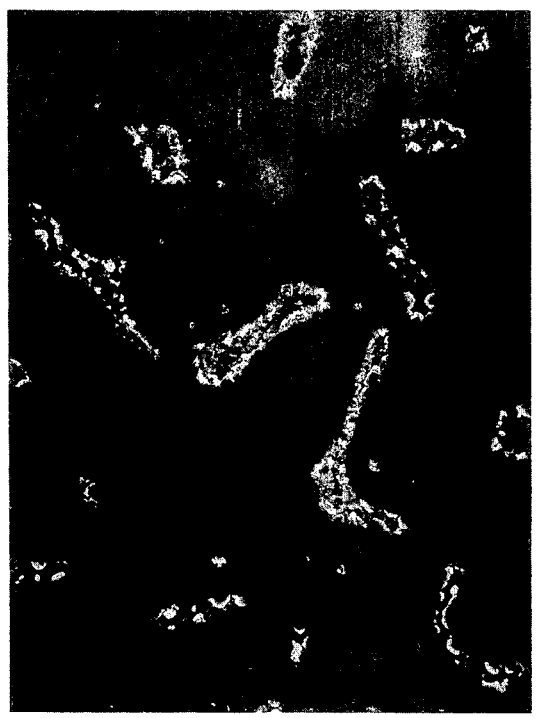
FIG. 3 is a photomicrograph showing the effect of incipient melting on a nickel superalloy single crystal.
Figure 4:
FIG. 4 is a photomicrograph showing that the effects of incipient melting in single crystals may be eliminated.

One aspect of the invention is illustrated in FIG. 2. FIG. 2 displays a heat treatment cycle similar to that shown in FIG. 1 except that during the course of the heat treatment cycle the temperature of the articles being heat treated exceeds the incipient melting temperature. At the point in the cycle where the article temperature exceeds the incipient melting temperature, some incipient melting will occur. Provided the article is a single crystal and provided that the portion of the heat treatment cycle subsequent to the incipient melting temperature is conducted at the proper time and temperature, we have found that the detrimental effects of the incipient melting can be completely eradicated from the article. The healing effect of a proper solution heat treatment on a superalloy single crystal article can be seen in FIGS. 3 and 4. FIG. 3 is a photomicrograph of a nickel base superalloy single crystal article after exposure at a temperature of 2375° F. for two hours. Since the incipient melting temperature of this alloy in the as cast condition is approximately 2360°–2365° F., incipient melting has occurred as can clearly be seen in the photomicrograph. FIG. 4 is a photomicrograph at the same magnification of the same alloy which had undergone incipient melting at 2375° F. and subsequently been given at a healing heat treatment. FIG. 4 clearly illustrates that evidence of incipient melting has been completely eliminated. Measurements of mechanical properties confirm that the prior incipient melting has not caused any permanent detriment on these properties after it has been properly heat treated.

Thus there are at least two major aspects to this invention. The first aspect is the use of a solution heat treatment which intentionally causes incipient melting coupled with subsequent repair of the resultant damage. This permits the use of shorter heat treatments at higher temperatures without concern for incipient melting. As will be discussed below the use of higher temperatures can increase mechanical properties and the elimination of concern about incipient melting can permit compositional changes for yet higher strengths. The second aspect of the invention is the repair of single crystal articles which have previously undergone incipient melting.

With respect to the first aspect, the use of a stepped heat treatment cycle which deliberately produces some degree of incipient melting, the required steps in the heat treatment cycle are that the alloy be to a temperature below but within about 25° F. of its incipient melting temperature and held below its incipient melting temperature for a period of time sufficient to achieve substantial amount of alloy homogenization. The temperature is then increased to a temperature above its incipient melting temperature thereby causing incipient melting of the alloy article, preferably less than 5% by volume and holding the article at a temperature above the incipient melting temperature for a period of time sufficient to cause the incipient melting temperature of the alloy to increase to above that temperature at which the alloy article is being held for a period of time sufficient to cause substantial healing of the previously incurred incipient melting.

Figure 5:
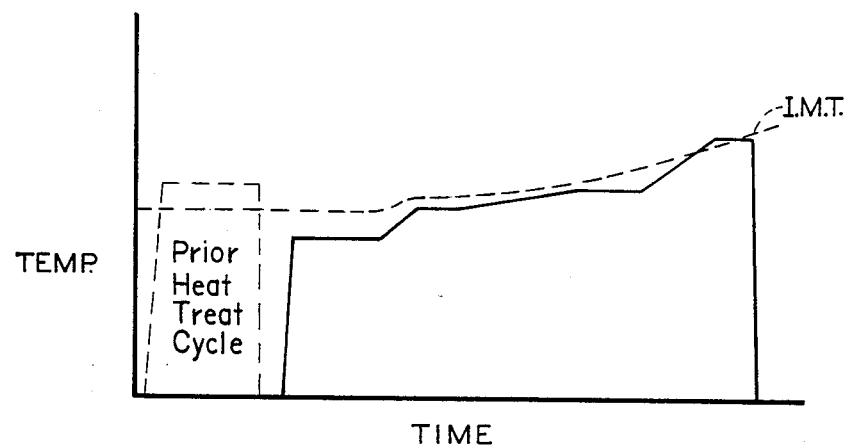
FIG. 5 illustrates a heat treatment for repairing previously incipiently melted single crystals.

The second aspect of the invention is the use of a stepped heat treatment to repair single crystal damage caused by previous heat treatment above the incipient melting temperature. In this situation the incipient melted article is held at a temperature below but within 25° F. of its incipient melting temperature for a period of time to achieve a significant (e.g. 50% by vol.) amount of homogenization and partial healing of prior incipient melting. The temperature is increased to above its actual incipient melting temperature and held at this temperature for a time sufficient to cause an increase in the incipient melting temperature to a temperature above the holding temperature. The article is held at this temperature for a time sufficient to cause further homogenization and healing of prior incipient melting. This heat treatment is depicted in FIG. 5.

Figure 6:
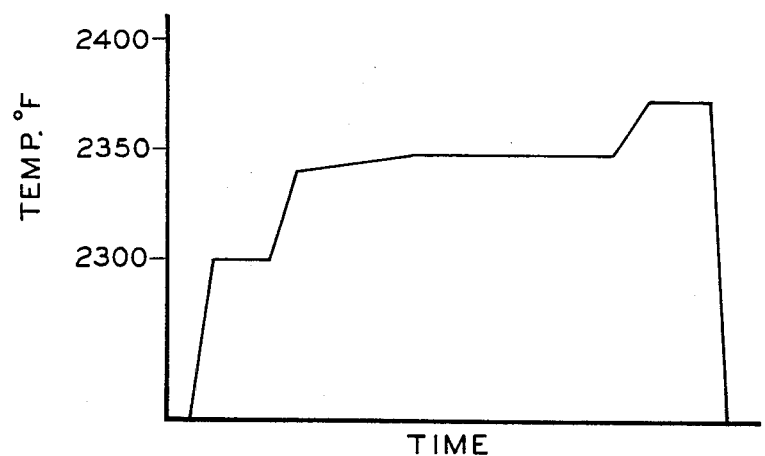
FIG. 6 illustrates a particular heat treatment for a specific composition single crystal.

U.S. Pat. No. 4,209,348 describes a nickel base single crystal superalloy composition and article having highly desirable combination of mechanical properties and resistance to oxidation and corrosion at elevated temperatures. The article composition is from about 8 to about 12% chromium, from about 4.5 to about 5.5% aluminum, from about 1 to about 2% titanium, from about 3 to about 5% tungsten, from about 10 to about 14% tantalum, from about 3 to about 7% cobalt, the balance essentially nickel where all percentages are weight percentages. This is the composition of the samples shown in FIGS. 3 and 4. FIG. 6 illustrates a heat treatment cycle which has been developed to produce maximum mechanical properties in this alloy. The alloy in its as cast condition has an incipient melting temperature of 2360°–2365° F., although it will be appreciated that differences in solidification procedures may cause slight differences in incipient melting temperature and that even within the same part differences in section size can result in minor differences in incipient melting temperature. As shown in FIG. 6 the article is initially heated to a temperature of 2300°±25° F. and held at this temperature for at least 30 minutes. This initial treatment helps insure that the parts are at a uniform temperature. The parts are next heated to a temperature of 2340°±10° F. at a rate of about 0.5°–2° F. per minute and from 2340° F. are heated to a temperature of 2350°±5° F. at a slower rate of about 10°±5° F. per hr. The parts are held at 2350° F. for a time of 2±1 hour and are then heated to a temperature of 2370°±10° F. at a rate of about 0.1°–1° F. per minute. The parts are held at 2375° F. for a period of about 15–60 minutes and are then cooled to a temperature below 1000° F. at a rate in excess of 100° F. per minute. This final cooling rate plays an important role in producing an optimum gamma prime morphology.

When parts of this composition were initially evaluated, a single step solution heat treatment at 2340° F. was employed in order to avoid melting of the parts due to temperature fluctuations and variations in incipient melting temperature in the parts. The minimum figure used for design purposes for the intended application was a minimum of 10 hours to 1% creep and 36 hours rupture life when tested at 1800° F. with a 36 ksi applied load. When the parts were given a single step 2340° F. solution heat treatment, the time to 1% creep under these testing conditions was typically less than 9 hours and the typical rupture life was 40 hours. In addition rejection rates of up to 40% were encountered. These results were unsatisfactory and led to the present invention. When the present invention was employed with a specific cycle shown in FIG. 6, with a 2375° F. maximum temperature, the time to 1% creep was increased from typically less than 9 hours to about 23 hours and the rupture life was increased from about 40 hours to about 74 hours under the 1800° F./36 ksi testing conditions.

The composition range for the alloy permits the sum of the aluminum and titanium to range from 5.5 to 7.5 weight percent. The initial production specification added the requirement that the sum of the aluminum and titanium lie between 6 and 7 percent. However, the problems with incipient melting made it necessary to restrict the aluminum and titanium to lie between about 6 and 6.2% since higher levels of aluminum and titanium increase the problems of incipient melting. Since aluminum and titanium form the gamma prime phase which is in large part responsible for the strength of the alloy, the restriction of the aluminum and titanium to the lower end of the range reduce the potential mechanical properties of the material and substantially diminished the benefits attributed to the composition and single crystal form. Through the use of the present invention it was found that the aluminum and titanium content could readily be increased to more than 6.6%. The significance of this will be appreciated by noting that an alloy composition having (Al+Ti) equal to 6.03% had a yield strength at 1100° F. of about 135 ksi whereas an alloy having (Al+Ti) equal to 6.6 wt% had an 1100° F. yield strength of about 158 ksi when both alloys were given the same solution heat treatment according to the present invention. Thus not only does the heat treatment of the present invention completely avoid detrimental results due to incipient melting but it also permits the use of higher strength variations on the original alloy composition which produce yield strengths almost 20% stronger than the compositions which were formerly used due to problems with incipient melting.

It should be understood that the invention is not limited to the particular embodiments shown and described herein, but that various changes and modifications may be made without departing from the spirit and scope of this novel concept as defined by the following claims.

We claim:

1. Method for heat treating single crystal superalloy articles for improved mechanical properties including the steps of
   a. heating the articles to a temperature below but within about 25° F. of the incipient melting temperature for a period sufficient to achieve a significant amount of homogenization,
   b. increasing the temperature of the articles to a temperature at least 5° F. above the incipient melting temperature thereby causing incipient melting in at least some of the articles,
   c. holding the articles above the incipient melting temperature for a period of time sufficient to cause substantial healing of the incipient melting, and
   d. cooling the article at a rate in excess of about 100° F./min to below about 2000° F.

2. Method for improving the properties of single crystal superalloy articles which have previously been heat treated under conditions which have caused significant incipient melting, said incipient melting being evident through microstructural examination and through substantial deficiencies in mechanical properties, including the steps of
   a. heating the articles to a temperature below but within about 25° F. of the incipient melting temperature for a period sufficient to achieve a significant amount of homogenization and partial "healing" of the prior incipient melting, and to increase the incipient melting temperature,
   b. increasing the temperature of the articles to a temperature at least 5° F. above the initial incipient melting temperature to cause further homogenization, healing of prior incipient melting and increase in the incipient melting temperature,
   c. holding the articles above the initial incipient melting temperature for a period of time sufficient to cause essentially complete healing of the prior incipient melting,
   d. cooling the article at a rate in excess of about 100° F./min to below about 2000° F.

whereby the detrimental effects of previous incipient melting are essentially completely eliminated.

3. Method for heat treating a single crystal superalloy article, having a composition of 8–12% Cr, 4.5–5.5% Al, 1–2% Ti, 3–5% W, 10–14% Ta, 3–7% Co, balance essentially nickel, including the steps of
   a. heating the article to 2300°±25° F. and holding at that temperature for at least 0.5 hr,
   b. heating the article to 2340°±10° F. at a rate of 0.5°–2° F. per min,
   c. increasing the article temperature to 2350°±5° F. at a rate of 10°±5° F. per hr,
   d. holding the article at 2350°±5° F. for a period of 2±1 hr,
   e. heating the article to 2370°±10° F. at a rate of 0.1°–1° F. per min,
   f. holding the article at 2370°±10° F. for a period of 15–60 min, and
   g. cooling the article to below about 2000° F. at a rate in excess of about 100° F./min.

* * * * *